(12) United States Patent
Matsuzaki

(10) Patent No.: US 11,531,367 B2
(45) Date of Patent: Dec. 20, 2022

(54) CIRCUIT DEVICE AND REAL-TIME CLOCK DEVICE

(71) Applicant: Seiko Epson Corporation, Tokyo (JP)

(72) Inventor: Sho Matsuzaki, Ina (JP)

(73) Assignee: SEIKO EPSON CORPORATION

(*) Notice: Subject to any disclaimer, the term of this patent is extended or adjusted under 35 U.S.C. 154(b) by 0 days.

(21) Appl. No.: 17/371,310

(22) Filed: Jul. 9, 2021

(65) Prior Publication Data

US 2022/0011808 A1  Jan. 13, 2022

(30) Foreign Application Priority Data

Jul. 10, 2020 (JP) .............................. JP2020-118983

(51) Int. Cl.
*G06F 1/08* (2006.01)
*H03C 3/09* (2006.01)

(52) U.S. Cl.
CPC .............. *G06F 1/08* (2013.01); *H03C 3/0966* (2013.01)

(58) Field of Classification Search
CPC .............................. G06F 1/08; H03C 3/0966
USPC ......................................................... 327/291
See application file for complete search history.

(56) References Cited

U.S. PATENT DOCUMENTS

2014/0062535 A1* 3/2014 Chen .................... H03K 17/223
327/78
2022/0216866 A1* 7/2022 Kashima ................ H03K 17/60

FOREIGN PATENT DOCUMENTS

JP    2009-123168 A    6/2009
WO   2009/066575 A1   5/2009

* cited by examiner

*Primary Examiner* — Tomi Skibinski
(74) *Attorney, Agent, or Firm* — Harness, Dickey & Pierce, P.L.C.

(57) ABSTRACT

A circuit device includes a comparator, a reference voltage generation circuit, and a coupling control circuit. The comparator is configured to output a power-on reset signal by comparing a monitoring target voltage generated from a power supply voltage with a reference voltage. The reference voltage generation circuit is configured to generate the reference voltage. The coupling control circuit is coupled between a power supply voltage node and a reference voltage node. The coupling control circuit couples the reference voltage node and the power supply voltage node in a predetermined period after the power supply voltage is supplied.

10 Claims, 9 Drawing Sheets

CIRCUIT DEVICE AND REAL-TIME CLOCK DEVICE

The present application is based on, and claims priority from JP Application Serial Number 2020-118983, filed Jul. 10, 2020, the disclosure of which is hereby incorporated by reference herein in its entirety.

BACKGROUND

1. Technical Field

The present disclosure relates to a circuit device, a real-time clock device, and the like.

2. Related Art

There has been known a power-on reset circuit that generates an internal reset signal of a circuit when power is supplied to the circuit or when a power supply voltage is lowered. JP-A-2009-123168 discloses a power-on reset circuit that changes a threshold value of an internal reset signal in accordance with an external reset signal supplied from an outside in a combination type IC card including a non-contact interface and a contact interface.

The power-on reset circuit described in JP-A-2009-123168 generates an internal reset signal by comparing a voltage obtained by dividing a power supply voltage with a reference voltage generated by a regulator. When initial power supply is supplied, behavior of the regulator that generates the reference voltage may be unstable, for example, rising of the reference voltage does not follow the power supply voltage. Due to such unstable behavior of the regulator, the power-on reset circuit may release reset at an unintended voltage.

SUMMARY

An aspect of the present disclosure relates to a circuit device including: a comparator configured to output a power-on reset signal by comparing a monitoring target voltage generated from a power supply voltage with a reference voltage; a reference voltage generation circuit configured to generate the reference voltage and output the reference voltage to a reference voltage node; and a coupling control circuit coupled between the reference voltage node and a power supply voltage node to which the power supply voltage is supplied. The coupling control circuit couples the reference voltage node and the power supply voltage node in a predetermined period after the power supply voltage is supplied.

Another aspect of the present disclosure relates to a real-time clock device including: the circuit device described above; and a resonator. The circuit device includes: a regulator configured to generate, when the power supply voltage is a first power supply voltage, a second power supply voltage as the monitoring target voltage from the first power supply voltage; a processing circuit configured to operate based on the second power supply voltage and to be reset and released from reset by the power-on reset signal; and an oscillation circuit configured to generate a clock signal by oscillating the resonator. The processing circuit includes a timing circuit configured to perform a timing process based on the clock signal.

DESCRIPTION OF EXEMPLARY EMBODIMENTS

Hereinafter, preferred embodiments of the present disclosure will be described in detail. It should be noted that the present embodiment described below does not unduly limit contents described in claims, and all configurations described in the present embodiment are not necessarily essential constituent elements.

1. Basic Configuration Example

First, a basic configuration example of a power-on reset circuit 130 and a problem thereof will be described, and then a configuration example of the power-on reset circuit 130 according to the present embodiment will be described with reference to FIG. 4 and subsequent drawings. However, the basic configuration example has constituent elements common to a configuration example in FIG. 4, and the constituent elements exhibit the same operational effects as those of the configuration example in FIG. 4. This point will be described later with reference to FIG. 4 and subsequent drawings.

Figure 1:
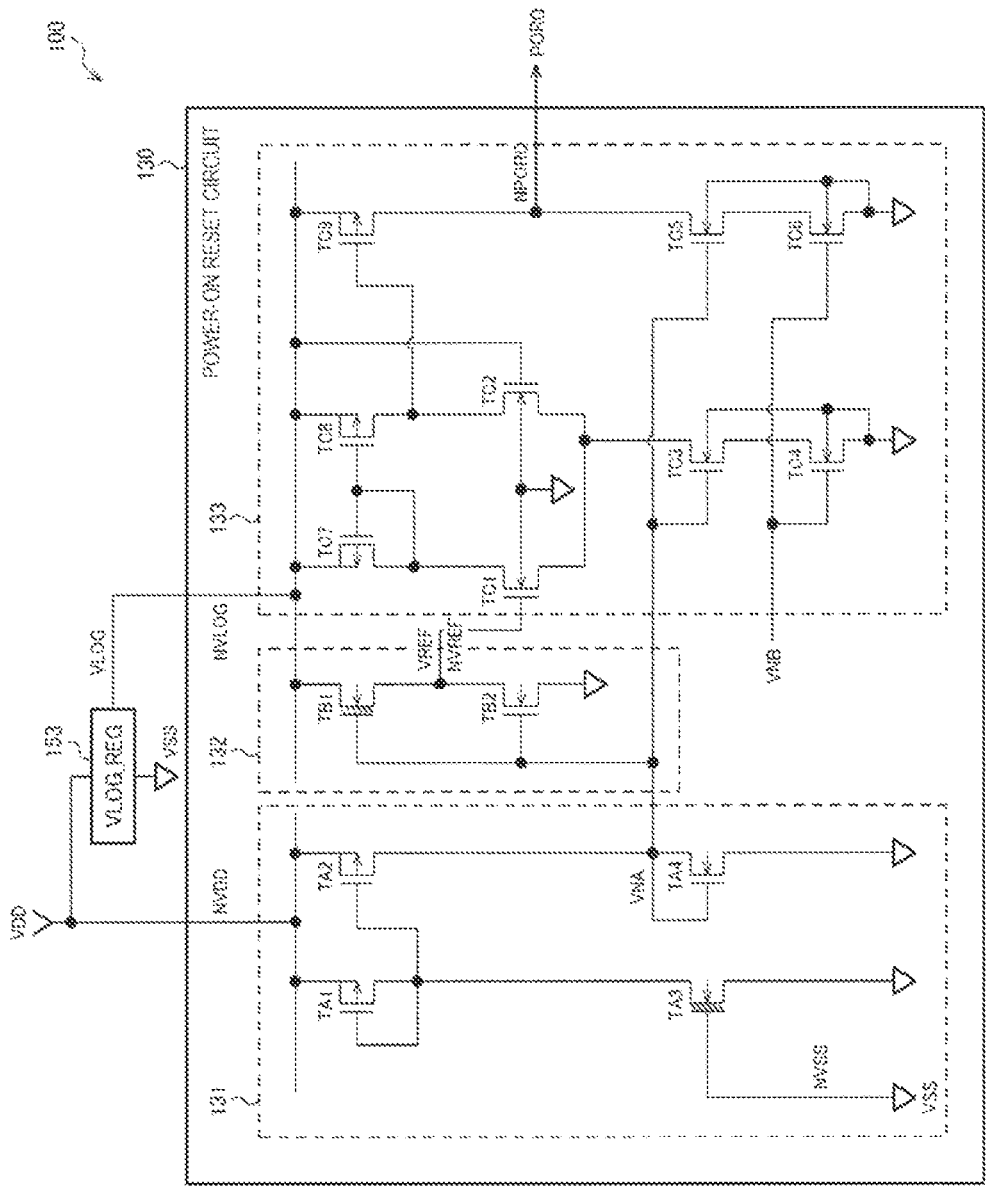
FIG. 1 is a basic configuration example of a power-on reset circuit and a circuit device.

FIG. 1 shows a basic configuration example of the power-on reset circuit 130 and a circuit device 100. The circuit device 100 includes the power-on reset circuit 130 and a regulator 153. The power-on reset circuit 130 includes a bias circuit 131, a reference voltage generation circuit 132, and a comparator 133.

A power supply voltage VDD is supplied to the bias circuit 131. The bias circuit 131 generates a bias voltage VNA based on the power supply voltage VDD, and outputs the bias voltage VNA to the reference voltage generation circuit 132 and the comparator 133. The power supply voltage VDD is supplied from an outside of the circuit device 100.

A power supply voltage VLOG is supplied to the reference voltage generation circuit 132. The reference voltage generation circuit 132 generates a reference voltage VREF based on the power supply voltage VLOG, and outputs the reference voltage VREF to the comparator 133. The power supply voltage VLOG is an internal power supply voltage of the circuit device 100, and the regulator 153 generates the power supply voltage VLOG from the power supply voltage VDD.

The power supply voltage VLOG is supplied to the comparator 133. The comparator 133 compares the power supply voltage VLOG as a monitoring target voltage with the reference voltage VREF, and outputs the result as a power-on reset signal PORQ. The monitoring target voltage is a voltage to be monitored by the power-on reset circuit 130 so as to determine switching between reset and release from reset. The comparator 133 outputs a power-on reset signal PORQ indicating reset when the power supply voltage VLOG is lower than a determination voltage VREF+ Vof, and outputs a power-on reset signal PORQ indicating release from reset when the monitoring target voltage is higher than the determination voltage VREF+Vof. Vof is an input offset of the comparator 133. That is, Vof is an offset voltage of a differential pair that receives the monitoring target voltage and the reference voltage VREF. In the following description, it is assumed that the power-on reset signal PORQ indicating reset is at a low level and the power-on reset signal PORQ indicating release from reset is at a high level.

Figure 2:
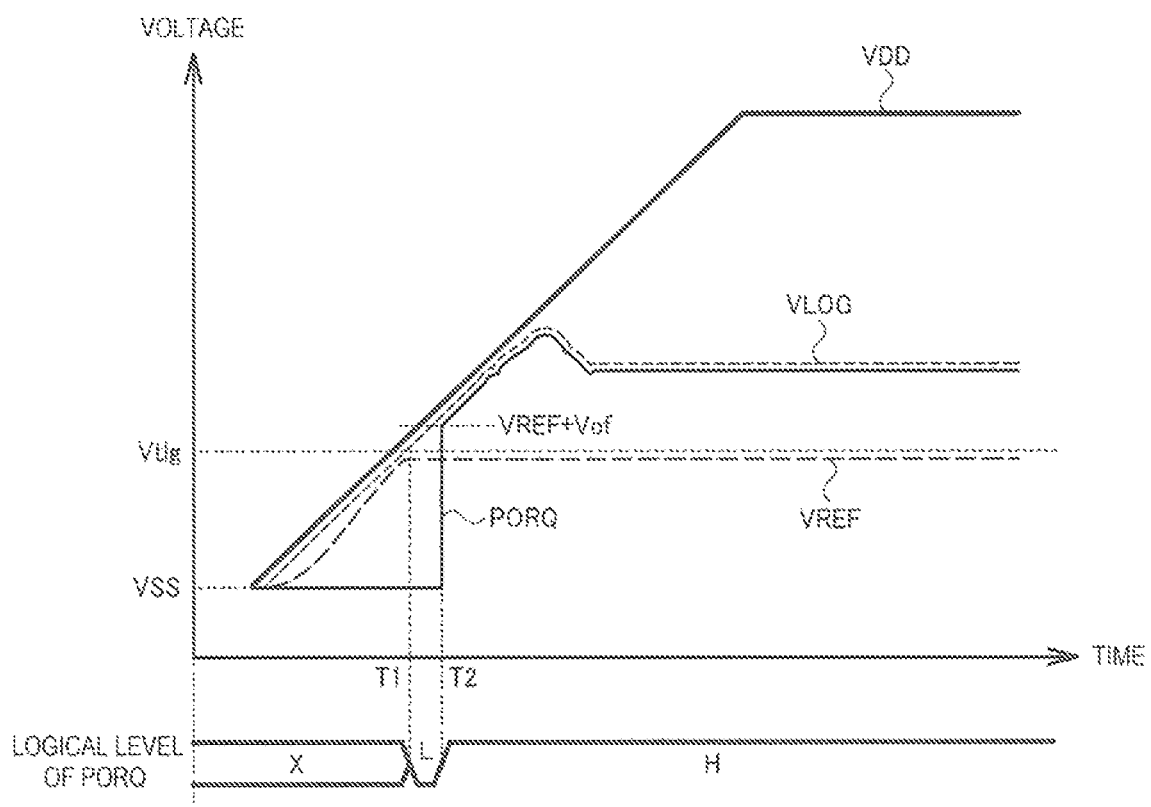
FIG. 2 is a waveform diagram showing a first operation of the power-on reset circuit according to the basic configuration example.

FIG. 2 is a waveform diagram showing a first operation of the power-on reset circuit 130 in FIG. 1. In FIG. 2, it is assumed that the power supply voltage VDD rises with a relatively gradual change over time.

Vtlg is a logic threshold voltage of a logic circuit that receives the power-on reset signal PORQ. That is, when the power supply voltage VLOG of the comparator 133 is lower than the logic threshold voltage Vtlg, a logic level of the power-on reset signal PORQ is indefinite for the logic circuit. When the power supply voltage VLOG is equal to or higher than the logic threshold voltage Vtlg, the logic level of the power-on reset signal PORQ for the logic circuit is fixed to a low level or a high level.

The reference voltage VREF and the offset voltage Vof are set such that the determination voltage VREF+Vof after the reference voltage VREF converges to a predetermined voltage is higher than the threshold voltage Vtlg.

After the power supply voltage VDD is supplied to the circuit device 100, the power supply voltage VLOG generated by the regulator 153 rises following the power supply voltage VDD. When the power supply voltage VDD rises with a relatively gradual change over time, the reference voltage VREF rises following the power supply voltage VLOG. Therefore, the power supply voltage VLOG and the reference voltage VREF rise to be substantially the same voltage, and exceed the logic threshold voltage Vtlg in a state where the power supply voltage VLOG is lower than the determination voltage VREF+Vof. Assuming that this timing is T1, the logic level of the power-on reset signal PORQ is indefinite before the timing T1, and the logic level of the power-on reset signal PORQ is fixed to the low level at the timing T1. In FIG. 2, the indefinite state is shown by "X".

The reference voltage VREF converges to a predetermined voltage, and then the power supply voltage VLOG exceeds the determination voltage VREF+Vof. Assuming that this timing is T2, a voltage of the power-on reset signal PORQ changes from a ground voltage VSS to the power supply voltage VLOG at the timing T2, and the logic level of the power-on reset signal PORQ changes from the low level to the high level. That is, at the timing T2, the power-on reset circuit 130 outputs the power-on reset signal PORQ indicating release from reset.

In the first operation as described above, after the power-on reset signal PORQ indicating reset is output in a period from the timing T1 to the timing T2, the power-on reset signal PORQ indicating release from reset is output at the timing T2. As a result, a circuit that receives the power-on reset signal PORQ is normally reset and released from reset.

Figure 3:
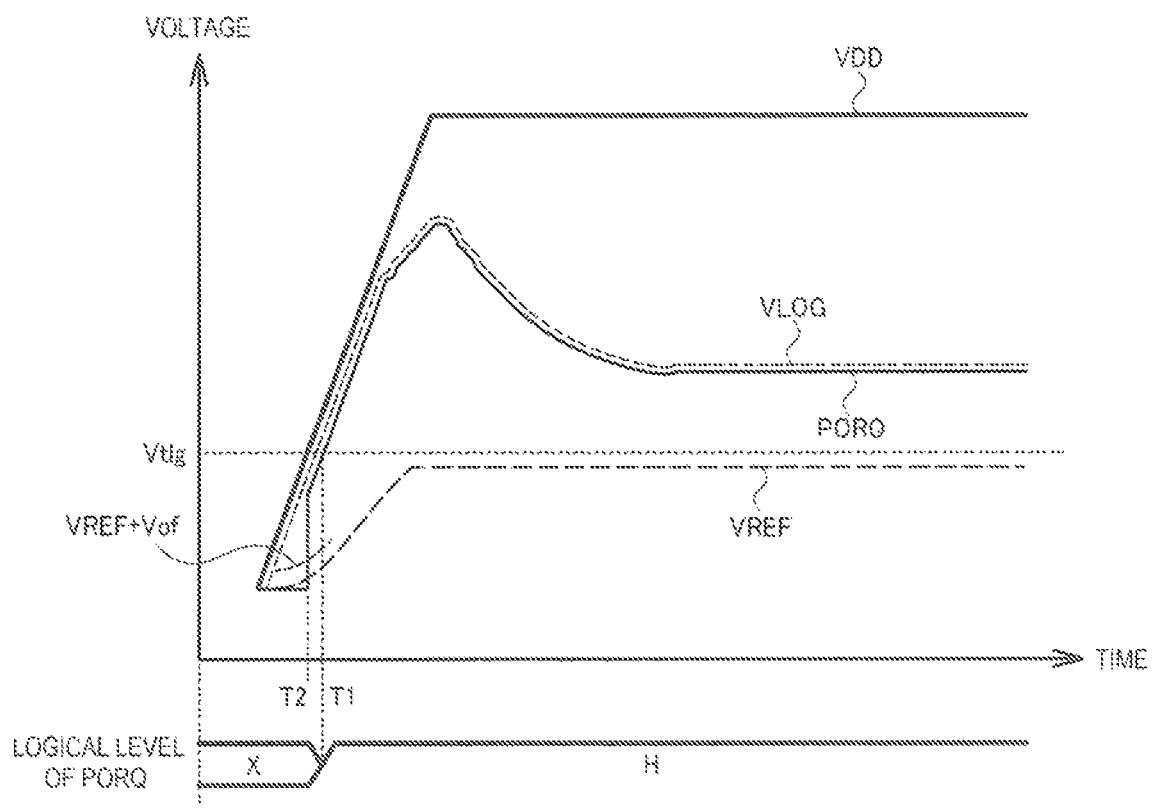
FIG. 3 is a waveform diagram showing a second operation of the power-on reset circuit according to the basic configuration example.

FIG. 3 is a waveform diagram showing a second operation of the power-on reset circuit 130 in FIG. 1. In FIG. 3, it is assumed that the power supply voltage VDD rises with a relatively steep change over time.

After the power supply voltage VDD is supplied to the circuit device 100, the power supply voltage VLOG generated by the regulator 153 rises following the power supply voltage VDD. When the power supply voltage VDD rises with a relatively steep change over time, the reference voltage VREF does not follow the power supply voltage VLOG. A rate at which the reference voltage VREF rises is determined by a current flowing through the reference voltage generation circuit 132 or the like. When a rate at which the power supply voltage VDD rises is faster than the rate at which the reference voltage VREF rises, the reference voltage VREF does not follow the power supply voltage VLOG. For example, when the current flowing through the reference voltage generation circuit 132 is reduced so as to reduce power consumption, a state where the reference voltage VREF does not follow the power supply voltage VLOG is likely to occur.

Since the power supply voltage VLOG follows the power supply voltage VDD while the reference voltage VREF does not follow the power supply voltage VDD, the power supply voltage VLOG exceeds the determination voltage VREF+ Vof before the power supply voltage VLOG exceeds the logic threshold voltage Vtlg. The logic level of the power-on reset signal PORQ is fixed at the timing T1 when the power supply voltage VLOG exceeds the logic threshold voltage Vtlg, and since the power supply voltage VLOG exceeds the determination voltage VREF+Vof at the timing T2 before that, the logic level of the power-on reset signal PORQ is fixed to the high level at the timing T1.

In the second operation, it is determined that reset inside the power-on reset circuit 130 is released at the timing T2, but the reference voltage VREF at that time does not converge to a predetermined voltage, and the determination voltage VREF+Vof does not become an originally intended voltage. Therefore, the power-on reset signal PORQ indicating reset is not output, and the power-on reset signal PORQ indicating release from reset is output at the timing T1, and the circuit that receives the power-on reset signal PORQ is not normally reset.

As described above, depending on rising waveforms, characteristics of change over time, or voltage conditions of the power supply voltage VDD, the power supply voltage VLOG, and the reference voltage VREF when the power supply voltage is supplied, the power-on reset circuit 130 may be released from reset even though the monitoring target voltage does not exceed the intended determination voltage. As described above, the same problem occurs in the related art such as JP-A-2009-123168.

2. Configuration Example

Figure 4:
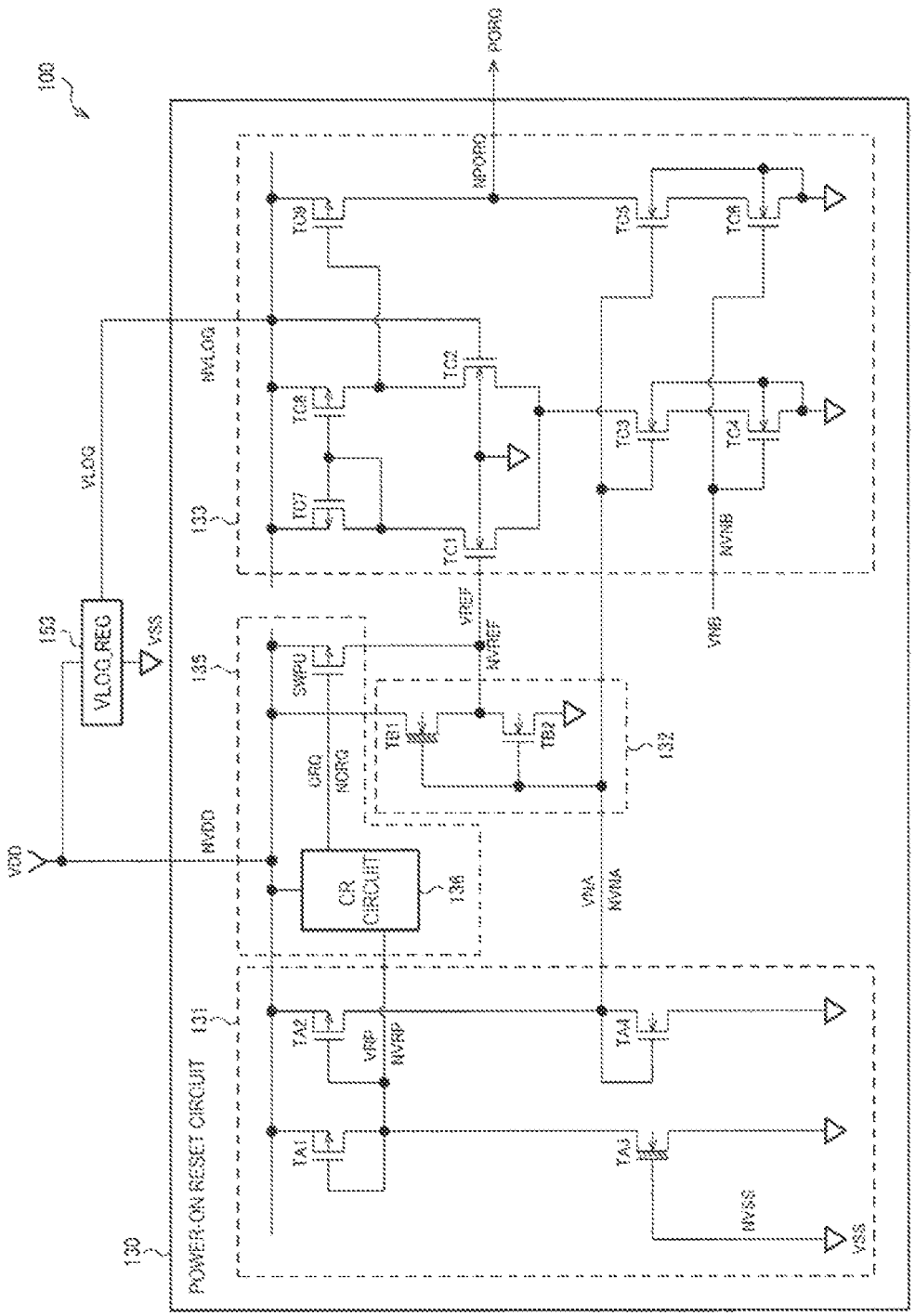
FIG. 4 is a configuration example of the power-on reset circuit and the circuit device.

FIG. 4 is a configuration example of the power-on reset circuit 130 and the circuit device 100 according to the present embodiment. The power-on reset circuit 130 in FIG. 4 includes the bias circuit 131, the reference voltage generation circuit 132, the comparator 133, and a coupling control circuit 135. The same constituent elements as those described with reference to FIG. 1 are denoted by the same reference numerals, and the description of the constituent elements already described is omitted as appropriate.

The comparator 133 outputs the power-on reset signal PORQ by comparing a monitoring target voltage generated from the power supply voltage VDD with the reference voltage VREF. The reference voltage generation circuit 132 generates the reference voltage VREF and outputs the reference voltage VREF to a reference voltage node NVREF. The coupling control circuit 135 is coupled between the reference voltage node NVREF and a power supply voltage node NVDD that receives the power supply voltage VDD. The coupling control circuit 135 couples the reference voltage node NVREF and the power supply voltage node NVDD in a predetermined period after the power supply voltage VDD is supplied.

In FIG. 4, the monitoring target voltage is the power supply voltage VLOG generated from the power supply voltage VDD by the regulator 153. However, the monitoring target voltage is not limited to the power supply voltage VLOG, and may be any voltage generated from the power supply voltage VDD by any voltage generation circuit. In addition, a length of the predetermined period may be any period longer than, for example, a time for the reference voltage VREF to converge to a predetermined voltage after the power supply voltage VDD is supplied. Alternatively, the predetermined period may be any period longer than a time for the monitoring target voltage to exceed the logic threshold voltage Vtlg after the power supply voltage VDD is supplied. Since the time for the reference voltage VREF to converge to a predetermined voltage after the power supply voltage VDD is supplied and the time for the monitoring target voltage to exceed the logical threshold voltage Vtlg vary depending on a rising waveform of the power supply voltage VDD or the like, the predetermined period having, for example, a length with a margin for the variation may be set.

According to the present embodiment, since the coupling control circuit 135 couples the reference voltage node NVREF and the power supply voltage node NVDD in the predetermined period after the power supply voltage VDD is supplied to the circuit device 100, the monitoring target voltage does not exceed the determination voltage VREF+ Vof in the predetermined period. When the coupling control circuit 135 dis-couples the reference voltage node NVREF and the power supply voltage node NVDD after the predetermined period is elapsed, the reference voltage VREF converges to an intended predetermined voltage. As a result, after the reference voltage VREF converges to the intended predetermined voltage, the comparator 133 can compare the monitoring target voltage with the reference voltage VREF. That is, according to the present embodiment, the power-on reset circuit 130 does not determine that the reset is released before the monitoring target voltage exceeds the intended determination voltage VREF+Vof.

In addition, since it is not determined that reset is released in the predetermined period, the release from reset can be performed after the power supply voltage VLOG and the reference voltage VREF are stabilized. As a result, even when the reference voltage VREF does not follow the power supply voltage VDD as shown in FIG. 3 described above, it is determined that reset is released after the monitoring target voltage exceeds the intended determination voltage in the present embodiment. In addition, when the power supply voltage VDD rises, the power supply voltage VLOG as an internal power supply voltage of the circuit device 100 may have an unstable behavior such as overshoot. In the present embodiment, since it is not determined that reset is released in the predetermined period, the reset of the circuit to which the power supply voltage VLOG is supplied is released after the power supply voltage VLOG is stabilized.

Hereinafter, the configuration example in FIG. 4 will be described in detail.

The bias circuit 131 includes P-type transistors TA1 and TA2, a depletion N-type transistor TA3, and an N-type transistor TA4. A transistor that is not referred to as a depletion transistor is an enhancement transistor.

Sources of the P-type transistors TA1 and TA2 are coupled to the power supply voltage node NVDD to which the power supply voltage VDD is supplied. A drain of the P-type transistor TA1 is coupled to gates of the P-type transistors TA1 and TA2, a drain of the N-type transistor TA3, and a bias node NVRP. A source and a gate of the N-type transistor TA3 are coupled to a ground node NVSS to which the ground voltage VSS is supplied. A drain of the P-type transistor TA2 is coupled to a drain and a gate of the N-type transistor TA4 and a bias node NVNA. A source of the N-type transistor TA4 is coupled to the ground node NVSS. The ground voltage VSS may be a power supply voltage lower than the power supply voltage VDD and the power supply voltage VLOG as the monitoring target voltage.

When a drain current of the N-type transistor TA3 flows through the P-type transistor TA1, a bias voltage VRP is generated. The bias circuit 131 outputs the bias voltage VRP from the bias node NVRP to the coupling control circuit 135 and the comparator 133. The drain current of the N-type transistor TA3 is mirrored by the P-type transistor TA2, and a drain current of the P-type transistor TA2 flows through the N-type transistor TA4, whereby the bias voltage VNA is generated. The bias circuit 131 outputs the bias voltage VNA from the bias node NVNA to the reference voltage generation circuit 132 and the comparator 133.

The reference voltage generation circuit 132 includes a depletion N-type transistor TB1 and an N-type transistor TB2.

A drain of the N-type transistor TB1 is coupled to the power supply voltage node NVDD, and a source of the N-type transistor TB1 is coupled to a drain of the N-type transistor TB2 and the reference voltage node NVREF. A source of the N-type transistor TB2 is coupled to the ground node NVSS. Gates of the N-type transistors TB1 and TB2 are coupled to the bias node NVNA.

When the bias voltage VNA is input to the gates of the N-type transistors TB1 and TB2, a current flows through the N-type transistors TB1 and TB2. The reference voltage VREF is determined according to the current and a size of the N-type transistors TB1 and TB2. Here, the reference voltage VREF is a reference voltage that has converged to a predetermined voltage. For example, by changing a mirror ratio of the N-type transistors TA4 and TB2, the current flowing through the N-type transistor TB1 changes, and thus the reference voltage VREF can be adjusted. Alternatively, since a source-drain voltage of the N-type transistor TB1 changes by changing the size of the N-type transistor TB1, the reference voltage VREF can be adjusted. The size of the transistor is, for example, a gate length, a gate width, or both.

The comparator 133 includes N-type transistors TC1 to TC6 and P-type transistors TC7 to TC9.

Sources of P-type transistors TC7 and TC8 are coupled to a monitoring target node NVLOG to which the monitoring target voltage is supplied. A gate and the source of the P-type transistor TC7 are coupled to a gate of the P-type transistor TC8 and a drain of an N-type transistor TC1. A drain of the P-type transistor TC8 is coupled to a drain of the N-type transistor TC2 and a gate of the P-type transistor TC9. Sources of the N-type transistors TC1 and TC2 are coupled to a drain of the N-type transistor TC3. A gate of the N-type transistor TC1 is coupled to the reference voltage node NVREF, and a gate of the N-type transistor TC2 is coupled to the monitoring target node NVLOG. A source of the N-type transistor TC3 is coupled to a drain of an N-type transistor TC4, and a gate of the N-type transistor TC3 is coupled to the bias node NVNA. A source of the N-type transistor TC4 is coupled to the ground node NVSS, and a gate of the N-type transistor TC4 is coupled to a bias node NVNB. A bias voltage VNB is output from a bias circuit (not shown) to the bias node NVNB.

A source of the P-type transistor TC9 is coupled to the monitoring target node NVLOG, and the source of the P-type transistor TC9 is coupled to a drain of the N-type transistor TC5 and an output node NPORQ of the power-on reset circuit 130. A source of the N-type transistor TC5 is coupled to a drain of the N-type transistor TC6, and a gate of the N-type transistor TC5 is coupled to the bias node NVNA. A source of the N-type transistor TC6 is coupled to the ground node NVSS, and a gate of the N-type transistor TC6 is coupled to the bias node NVNB.

The N-type transistors TC1 and TC2 form a differential pair, the gate of the N-type transistor TC1 corresponds to a negative input node of the comparator 133, and the gate of the N-type transistor TC2 corresponds to a positive input node of the comparator 133. The reference voltage VREF is input to the negative input node, and the power supply voltage VLOG is input to the positive input node. The comparator 133 outputs the power-on reset signal PORQ of the power supply voltage VLOG to the output node NPORQ when VLOG>VREF, and outputs the power-on reset signal PORQ of the ground voltage VSS to the output node NPORQ when VLOG<VREF.

The coupling control circuit 135 includes a CR circuit 136 and a switch SWPU. The switch SWPU includes a transistor, and the transistor is assumed to be a P-type transistor here.

A source of the P-type transistor constituting the switch SWPU is coupled to the power supply voltage node NVDD, a drain of the P-type transistor is coupled to the reference voltage node NVREF, and a gate of the P-type transistor is coupled to a control signal node NCRQ.

The CR circuit 136 outputs, to the control signal node NCRQ, a control signal CRQ for controlling the switch SWPU to be ON or OFF, based on the power supply voltage VDD. The CR circuit 136 maintains the control signal CRQ at a low level in a predetermined period after the power supply voltage VDD is supplied, thereby maintaining the switch SWPU ON. The CR circuit 136 changes the control signal CRQ from the low level to a high level when the predetermined period is elapsed, thereby changing the switch SWPU from ON to OFF.

In the present embodiment described above, the coupling control circuit 135 includes the switch SWPU and the CR circuit 136. The switch SWPU is provided between the power supply voltage node NVDD and the reference voltage node NVREF. The CR circuit 136 outputs, to the switch SWPU, the control signal CRQ for controlling the switch SWPU from ON to OFF when the predetermined period is elapsed after the power supply voltage VDD is supplied.

According to the present embodiment, since the switch SWPU is turned on in the predetermined period after the power supply voltage VDD is supplied, the reference voltage node NVREF is coupled to the power supply voltage node NVDD. As a result, the reference voltage VREF input to the comparator 133 becomes the power supply voltage VDD in the predetermined period after the power supply voltage VDD is supplied. Since the switch SWPU changes from ON to OFF when the predetermined period is elapsed, the comparator 133 can compare the reference voltage VREF with the monitoring target voltage.

In the present embodiment, the reference voltage generation circuit 132 generates the reference voltage VREF based on the power supply voltage VDD.

When the switch SWPU couples the reference voltage node NVREF and the power supply voltage node NVDD, the power supply voltage node NVDD and the source of the N-type transistor TB2 are coupled via the switch SWPU and the N-type transistor TB1. Although it is not desirable to couple different power supply voltages such as the power supply voltage VDD and the power supply voltage VLOG, according to the present embodiment, the source of the N-type transistor TB2 is coupled to the power supply voltage node NVDD.

In the present embodiment, the reference voltage generation circuit 132 includes the depletion N-type transistor TB1 and the enhancement N-type transistor TB2. The depletion N-type transistor TB1 is provided between the power supply voltage node NVDD and the reference voltage node NVREF, and the bias voltage VNA is input to a gate of the depletion N-type transistor TB1. The enhancement N-type transistor TB2 is provided between the reference voltage node NVREF and the ground node NVSS, and the bias voltage VNA is input to a gate of the enhancement N-type transistor TB2.

According to the present embodiment, a minimum value of the power supply voltage VDD at which the comparator 133 normally operates can be lowered. A normal operation of the comparator 133 means that the transistor provided in the comparator 133 operates in a saturation region.

For example, a configuration is conceivable in which the reference voltage generation circuit 132 according to the present embodiment is not provided, the N-type transistor TC1 of the comparator 133 is of a depletion type, and the gate of the N-type transistor TC1 is coupled to the ground node NVSS. Assuming that the offset voltage of the differential pair in this configuration is Vof', the determination voltage for release from reset is Vof'. For example, a case is considered where the threshold voltage of the P-type transistor is increased and the threshold voltage of the N-type transistor is decreased due to a process variation. In this case, the P-type transistor TC8 cannot maintain the saturation region before the power supply voltage VLOG is decreased to the determination voltage Vof', the P-type transistor TC9 is turned on, the power-on reset signal PORQ becomes the high level, and reset may be released. For this reason, it is necessary to make the minimum value of the power supply voltage VLOG, which should be originally close to the determination voltage Vof', higher than the determination voltage Vof'. Since the power supply voltage VDD needs to be higher than at least the minimum value of the power supply voltage VLOG, the minimum value of the power supply voltage VDD needs to be increased.

In this regard, according to the present embodiment, by providing the reference voltage generation circuit 132 having the configuration described above, the N-type transistor TC1 of the differential pair can be made an enhancement type, and the offset voltage of the differential pair can be reduced. As described above, the reference voltage VREF can be adjusted by adjusting sizes of the N-type transistors TB1 and TB2 that constitute the reference voltage generation circuit 132. Since the offset voltage of the differential pair becomes small and the reference voltage VREF can be adjusted, the minimum value of the power supply voltage VDD at which the comparator 133 normally operates can be lowered.

As will be described later with reference to FIG. 8, for example, the power-on reset circuit 130 may be used in the circuit device 100 of a real-time clock device 200. In a system including the real-time clock device 200 and a processor such as a CPU or a microcomputer, the power supply voltage VDD is a system power supply voltage supplied to the processor and the real-time clock device 200. In such a system, since the real-time clock device 200 performs timing even when the processor does not operate, the real-time clock device 200 is required to operate at a low power supply voltage VDD at which the processor does not operate. Therefore, it is desirable that the minimum value of the power supply voltage VDD is low, and according to the present embodiment, the minimum value of the power supply voltage VDD can be reduced as much as possible.

In FIG. 1, the power supply voltage VLOG is supplied to the reference voltage generation circuit 132, and configurations of the transistors TB1 and TB2 are the same as those in FIG. 4. Therefore, an effect that the minimum value of the power supply voltage VDD at which the comparator 133 normally operates can be lowered are similarly established in the basic configuration example in FIG. 1.

Figure 5:
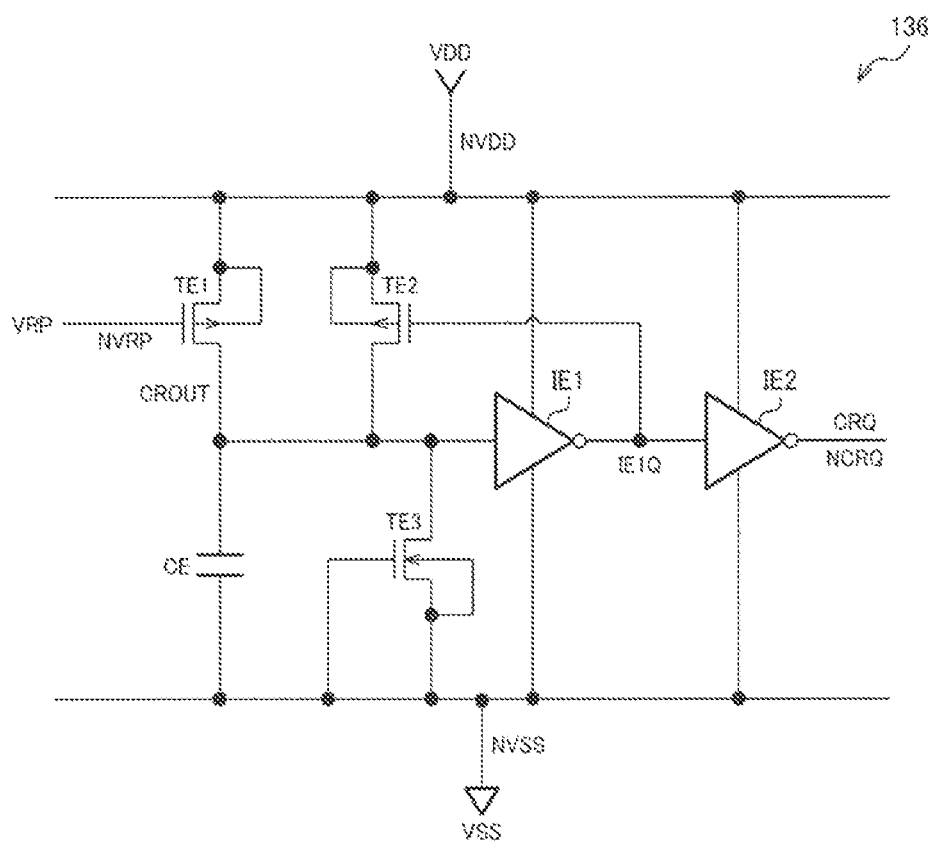
FIG. 5 is a detailed configuration example of a CR circuit.

FIG. 5 is a detailed configuration example of the CR circuit 136. The CR circuit 136 includes a first P-type transistor TE1, a second P-type transistor TA2, an N-type transistor TE3, a capacitor CE, a first inverter IE1, and a second inverter IE2.

The CR circuit outputs, to the switch SWPU, the control signal CRQ, which transitions from an active state to an inactive state when the predetermined period determined by a capacitance value of the capacitor CE is elapsed. The switch SWPU changes from ON to OFF when the control signal CRQ changes from the active state to the inactive state. The active state is a logic level at which the switch SWPU is turned on, and is a low level here. The inactive state is a logic level at which the switch SWPU is turned off, and is a high level here.

According to the present embodiment, the predetermined period is set by the capacitance value of the capacitor CE, and the control signal CRQ that changes from the active state to the inactive state when the predetermined period is elapsed is output. Specifically, when a voltage at one end of the capacitor CE is CROUT, a length of the predetermined period is determined according to a rate of a time change of the voltage CROUT. The rate of the time change of the voltage CROUT is determined by the capacitance value of the capacitor CE and a current flowing through the one end of the capacitor CE.

The first P-type transistor TE1 is provided between the power supply voltage node NVDD and the one end of the capacitor CE. The bias voltage VRP is input to a gate of the first P-type transistor TE1. Specifically, a source of the first P-type transistor TE1 is coupled to the power supply voltage node NVDD, a drain of the first P-type transistor TE1 is coupled to the one end of the capacitor CE, and a gate of the first P-type transistor TE1 is coupled to the bias node NVRP. The other end of the capacitor CE is coupled to the ground node NVSS.

According to the present embodiment, the first P-type transistor TE1 serves as a constant current source, and charges the capacitor CE by inputting a constant current to the one end of the capacitor CE. The length of the predetermined period is determined by a current value of the constant current and the capacitance value of the capacitor CE.

A drain of the N-type transistor TE3 is coupled to the one end of the capacitor CE, and a source and a gate of the N-type transistor TE3 are coupled to the ground node.

The first P-type transistor TE1 includes a parasitic diode whose forward direction is a direction from the one end of the capacitor CE to the power supply voltage node NVDD, and the N-type transistor TE3 includes a parasitic diode whose forward direction is a direction from the one end of the capacitor CE to the ground node NVSS. A forward voltage of these parasitic diodes is represented by Vdiode. When the voltage is in the vicinity of the ground voltage before the power supply voltage VDD is supplied, the voltage CROUT at the one end of the capacitor CE is in a range of −Vdiode to +Vdiode due to the parasitic diode. As a result, when the power supply voltage VDD is supplied, the voltage CROUT at the one end of the capacitor CE rises from an approximately determined voltage, and the predetermined period can be made substantially constant.

The voltage CROUT at the one end of the capacitor CE is input to the first inverter IE1. An output signal IE1Q of the first inverter IE1 is input to the second inverter IE2, and the second inverter IE2 outputs the control signal CRQ. The second P-type transistor TE2 is provided between the power supply voltage node NVDD and the one end of the capacitor CE, and the output signal IE1Q of the first inverter IE1 is input to a gate of the second P-type transistor TE2. Specifically, a source of the second P-type transistor TE2 is coupled to the power supply voltage node NVDD, a drain of the second P-type transistor TE2 is coupled to the one end of the capacitor CE, and a gate of the second P-type transistor TE2 is coupled to an output node of the first inverter IE1.

According to the present embodiment, the first inverter IE1 changes the output signal IE1Q from the high level to the low level when the voltage CROUT at the one end of the capacitor CE exceeds the logic threshold voltage. Since the second inverter IE2 outputs a logically inverted signal of the output signal IE1Q as the control signal CRQ, the control signal CRQ changes from the low level to the high level when the output signal IE1Q changes from the high level to the low level. In this way, a period from when the power supply voltage VDD is supplied to when the voltage CROUT at the one end of the capacitor CE exceeds the logic threshold voltage is the predetermined period.

According to the present embodiment, when the output signal IE1Q of the first inverter IE1 changes from the high level to the low level, the second P-type transistor TE2 changes from OFF to ON, and couples the one end of the capacitor CE and the power supply voltage node NVDD. As a result, the voltage CROUT at the one end of the capacitor CE is fixed to the power supply voltage VDD, and thus the control signal CRQ is fixed to the high level. That is, the second P-type transistor TE2 functions as a latch mechanism that maintains a reset release state after reset is released.

Figure 6:
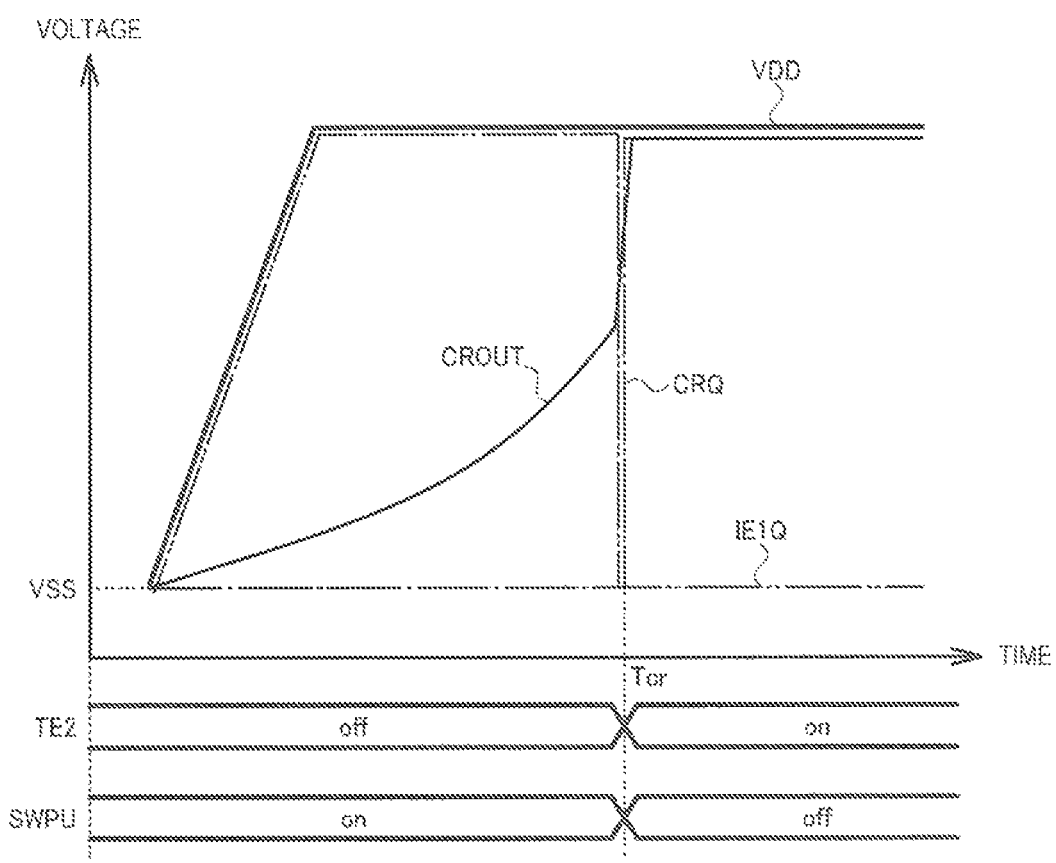
FIG. 6 is a waveform diagram showing operations of the CR circuit and a switch.

FIG. 6 is a waveform diagram showing operations of the CR circuit 136 and the switch SWPU. When the power supply voltage VDD is supplied, charging of the capacitor CE is started, and the voltage CROUT at the one end of the capacitor CE gradually rises. At a timing Tcr when the voltage CROUT reaches the logic threshold voltage of the first inverter IE1, the output signal IE1Q of the first inverter IE1 changes from the power supply voltage VDD to the ground voltage VSS. That is, the output signal IE1Q changes from the high level to the low level. As a result, the second P-type transistor TE2 changes from OFF to ON, and the voltage CROUT at the one end of the capacitor CE becomes the power supply voltage VDD.

Before the timing Tcr, the control signal CRQ as the output signal of the second inverter IE2 is at the low level. As a result, before the timing Tcr, the switch SWPU is turned on, and the reference voltage VREF becomes the power supply voltage VDD. At the timing Tcr, the control signal CRQ as the output signal of the second inverter IE2 changes from the low level to the high level. As a result, the switch SWPU changes from ON to OFF, the reference voltage node NVREF and the power supply voltage node NVDD are dis-coupled, and the reference voltage VREF generated by the reference voltage generation circuit 132 is input to the comparator 133. A period from when the power supply voltage VDD is supplied to the timing Tcr corresponds to the predetermined period. That is, the length of the predetermined period is determined by a time until the voltage CROUT at the one end of the capacitor CE reaches the logic threshold voltage of the first inverter IE1.

Figure 7:
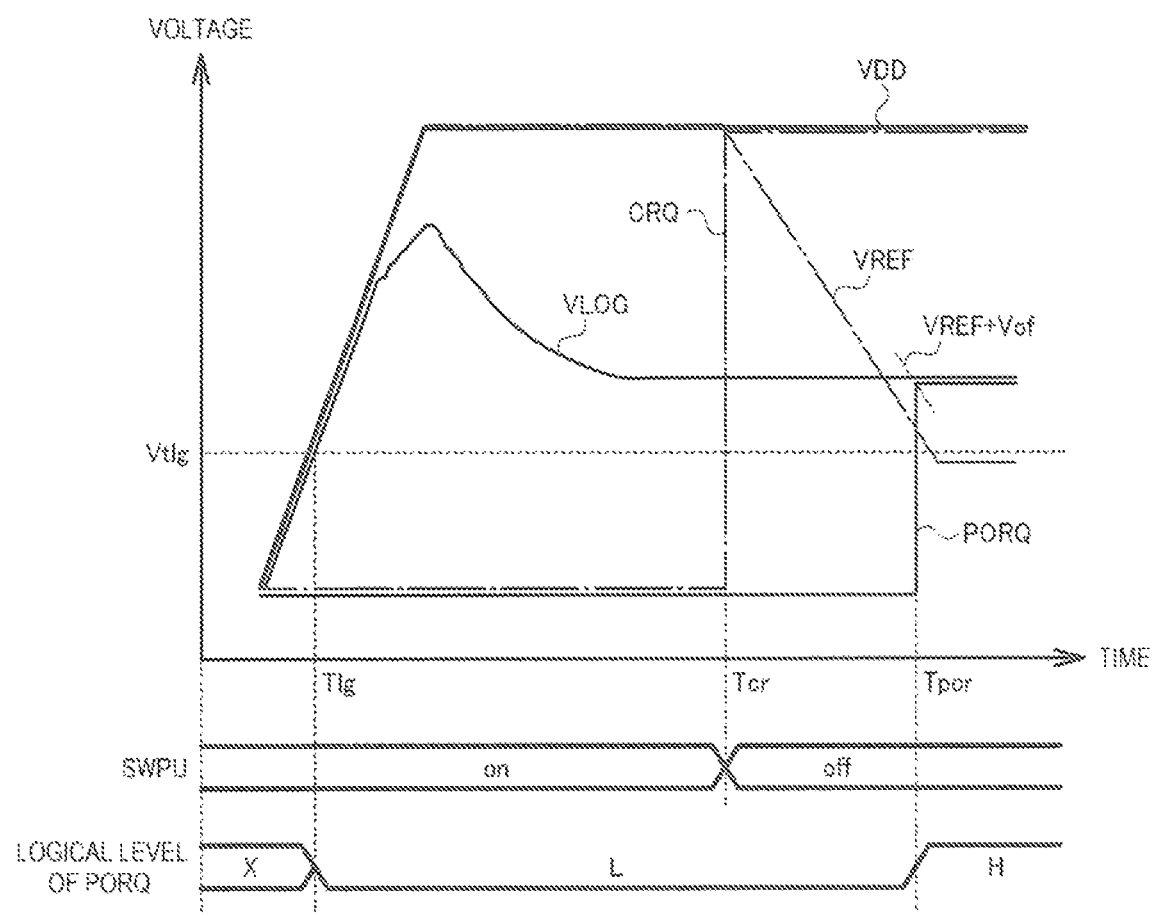
FIG. 7 is a waveform diagram showing an operation of the power-on reset circuit.

FIG. 7 is a waveform diagram showing an operation of the power-on reset circuit 130 shown in FIG. 4. When the power supply voltage VDD is supplied, the power supply voltage VLOG generated by the regulator 153 rises following the power supply voltage VDD, and then converges to a stable voltage. FIG. 7 shows an example in which the power supply voltage VLOG is stabilized after overshoot.

Since the switch SWPU is turned on from a time when the power supply voltage VDD is supplied to the timing Tcr, the reference voltage VREF has the same voltage as the power supply voltage VDD. Therefore, the determination voltage VREF+Vof of the comparator 133 is kept higher than the power supply voltage VLOG, and it is not determined that the reset is released.

At a timing Tlg at which the power supply voltage VLOG exceeds the logic threshold voltage Vtlg, the logic level of the power-on reset signal PORQ is fixed to the high level or the low level from the indefinite state X. By setting the capacitance value of the capacitor CE or the like such that the timing Tcr is after the timing Tlg, the power-on reset signal PORQ can be fixed to the low level at the timing Tlg. That is, the circuit that receives the power-on reset signal PORQ can be reliably reset.

At the timing Tcr, since the switch SWPU changes from ON to OFF, the reference voltage VREF is decreased from the power supply voltage VDD to a predetermined voltage. At a timing Tpor when the reference voltage VREF changes so that VREF+Vof<VLOG is satisfied, the power-on reset signal PORQ changes from the low level to the high level. As a result, the circuit that receives the power-on reset signal PORQ is released from reset.

As described above, the reference voltage VREF temporarily becomes the power supply voltage VDD, the reference voltage VREF is decreased to the predetermined voltage after the predetermined period is elapsed. As a result, it is not determined that the reset is released at an unintended voltage.

In addition, by setting the capacitance value of the capacitor CE or the like so that the timing Tcr is reached after the power supply voltage VLOG is stabilized, it is possible to release reset of the circuit operating at the power supply voltage VLOG after the power supply voltage VLOG is stabilized. When reset of the circuit is released while the power supply voltage VLOG is unstable, a problem such as malfunction of the circuit may occur, but according to the present embodiment, the possibility of such a problem can be reduced.

3. Real-Time Clock Device

As an example of the circuit device 100 including the power-on reset circuit 130, the circuit device 100 of the real-time clock device 200 will be described. However, the power-on reset circuit 130 can be incorporated in circuit devices for various applications.

Figure 8:
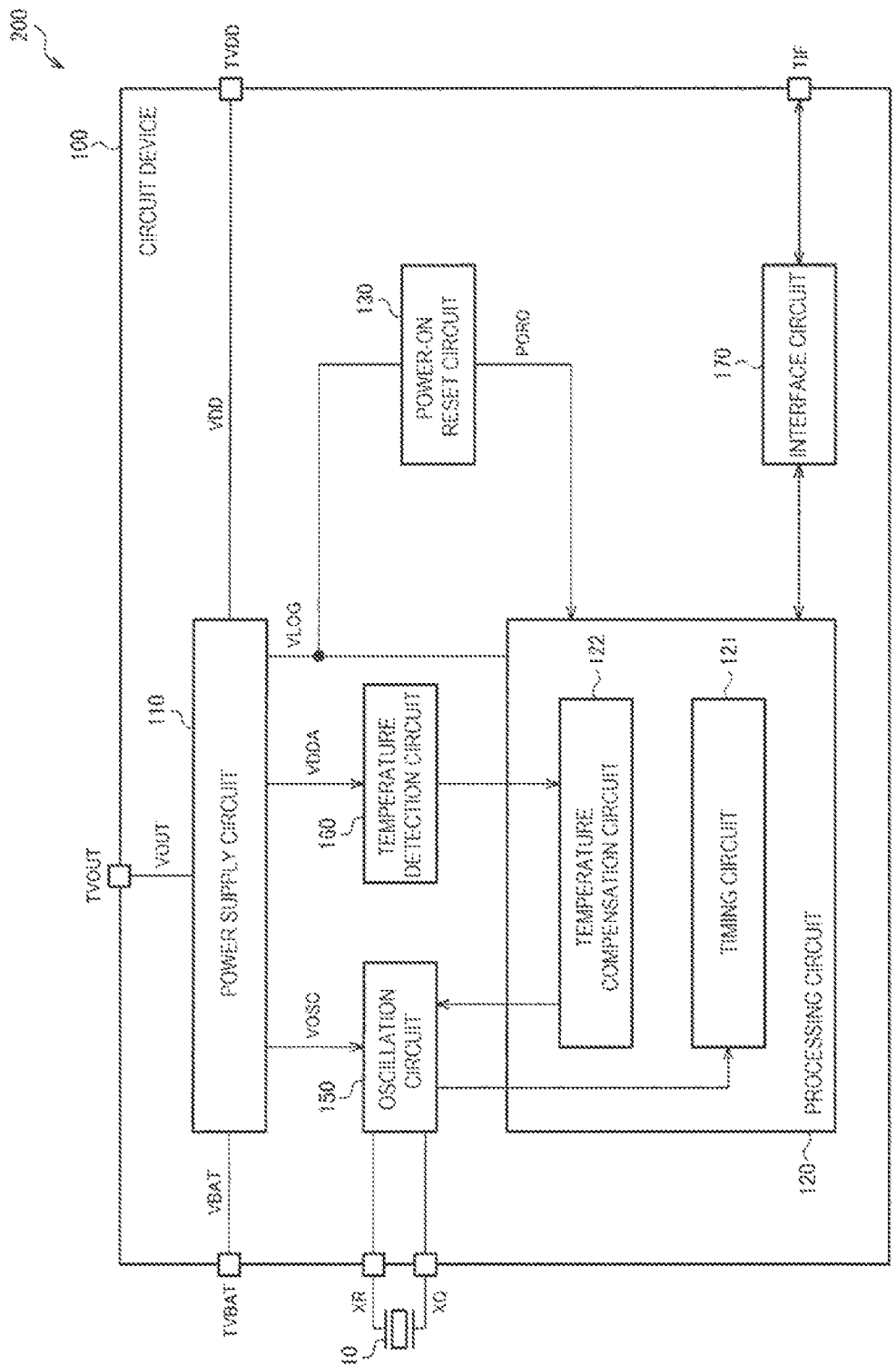
FIG. 8 is a configuration example of a real-time clock device and a configuration example of a circuit device provided in the real-time clock device.

FIG. 8 shows a configuration example of the real-time clock device 200 and a third configuration example of the circuit device 100. The real-time clock device 200 includes a resonator 10 and the circuit device 100. The circuit device 100 includes a power supply circuit 110, a processing circuit 120, the power-on reset circuit 130, an oscillation circuit 150, a temperature detection circuit 160, an interface circuit 170, and terminals TVDD, TVBAT, TVOUT, TIF, XI, and XQ. A power-on reset circuit 130 in FIG. 8 corresponds to the power-on reset circuit 130 in FIG. 1 or FIG. 4.

The power supply voltage VDD of the system including the real-time clock device 200 is supplied to the terminal TVDD. The system includes a processor as a host device of the real-time clock device 200, and the processor operates by the power supply voltage VDD. A battery is coupled to the terminal TVBAT, and a battery voltage VBAT is supplied from the battery. The battery is a secondary battery or a primary battery, and is a backup power supply of the real-time clock device 200. That is, when the power supply voltage VDD is not supplied and the processor does not operate, the real-time clock device 200 operates by the battery voltage VBAT.

The power supply circuit 110 monitors the power supply voltage VDD and the battery voltage VBAT, switches the power supply voltage VDD and the battery voltage VBAT based on the monitoring result, and outputs the selected voltage as a voltage VOUT. A stabilizing capacitor for stabilizing the voltage VOUT is coupled to the terminal TVOUT. The power supply circuit 110 generates, from the voltage VOUT, power supply voltages VOSC, VDDA, and VLOG as internal power supply voltages of the circuit device 100.

The processing circuit 120 is a logic circuit operated by the power supply voltage VLOG, and performs various processes including a timing process and controls each unit of the circuit device 100. The processing circuit 120 communicates with the processor via the interface circuit 170. The interface circuit 170 is coupled to the processor via the terminal TIF. Although the terminal TIF is omitted to one in FIG. 8, a plurality of terminals are actually provided for the interface. The power-on reset signal PORQ is input to the processing circuit 120, and the processing circuit 120 is reset and released from reset by the power-on reset signal PORQ. The processing circuit 120 includes a timing circuit 121 and a temperature compensation circuit 122.

The timing circuit 121 performs the timing process based on a clock signal generated by the oscillation circuit 150, and generates timing information. The timing circuit 121 includes a counter that performs a count operation by the clock signal, and outputs a count value of the counter as the timing information. A process of generating the timing information by the counting operation corresponds to the timing process. The timing information is information indicating a current time of the system, and indicates, for example, an elapsed time after the real-time clock device 200 is activated and initialized. The timing information can be read from the processor via the interface circuit 170.

The temperature compensation circuit 122 outputs temperature compensation data for making an oscillation frequency of the oscillation circuit 150 constant regardless of a temperature, based on temperature detection data output from the temperature detection circuit 160. The temperature compensation circuit 122 outputs the temperature compensation data by extracting the temperature compensation data corresponding to the temperature from a look-up table in which temperature characteristics of the oscillation frequency are tabulated, or by substituting the temperature into a polynomial function in which the temperature characteristics of the oscillation frequency are approximated.

The temperature detection circuit 160 includes a temperature sensor and an A/D conversion circuit, and operates at the power supply voltage VDDA. The temperature sensor outputs a temperature-dependent temperature detection voltage by utilizing temperature dependence of a forward voltage in a diode. The A/D conversion circuit performs A/D conversion on the temperature detection voltage and outputs the temperature detection data.

An input node and an output node of the oscillation circuit 150 are coupled to the terminals XI and XQ, and the oscillation circuit 150 oscillates by driving a resonator coupled to the terminals XI and XQ, and generates a clock signal by the oscillation. The resonator 10 is an element that generates mechanical oscillation by an electrical signal. The resonator 10 may be various resonators such as a crystal resonator plate, a piezoelectric resonator plate, an SAW resonator, and an MEMS resonator. SAW is an abbreviation for surface acoustic wave, and MEMS is an abbreviation for micro electro mechanical systems. The oscillation circuit 150 oscillates at an oscillation frequency corresponding to the temperature compensation data. For example, the oscillation circuit 150 includes a D/A conversion circuit that performs D/A conversion on the temperature compensation data, and a variable capacitance capacitor whose capacitance value is variably controlled by a D/A conversion output. One end of the variable capacitance capacitor is coupled to the input node or the output node of the oscillation circuit 150.

Figure 9:
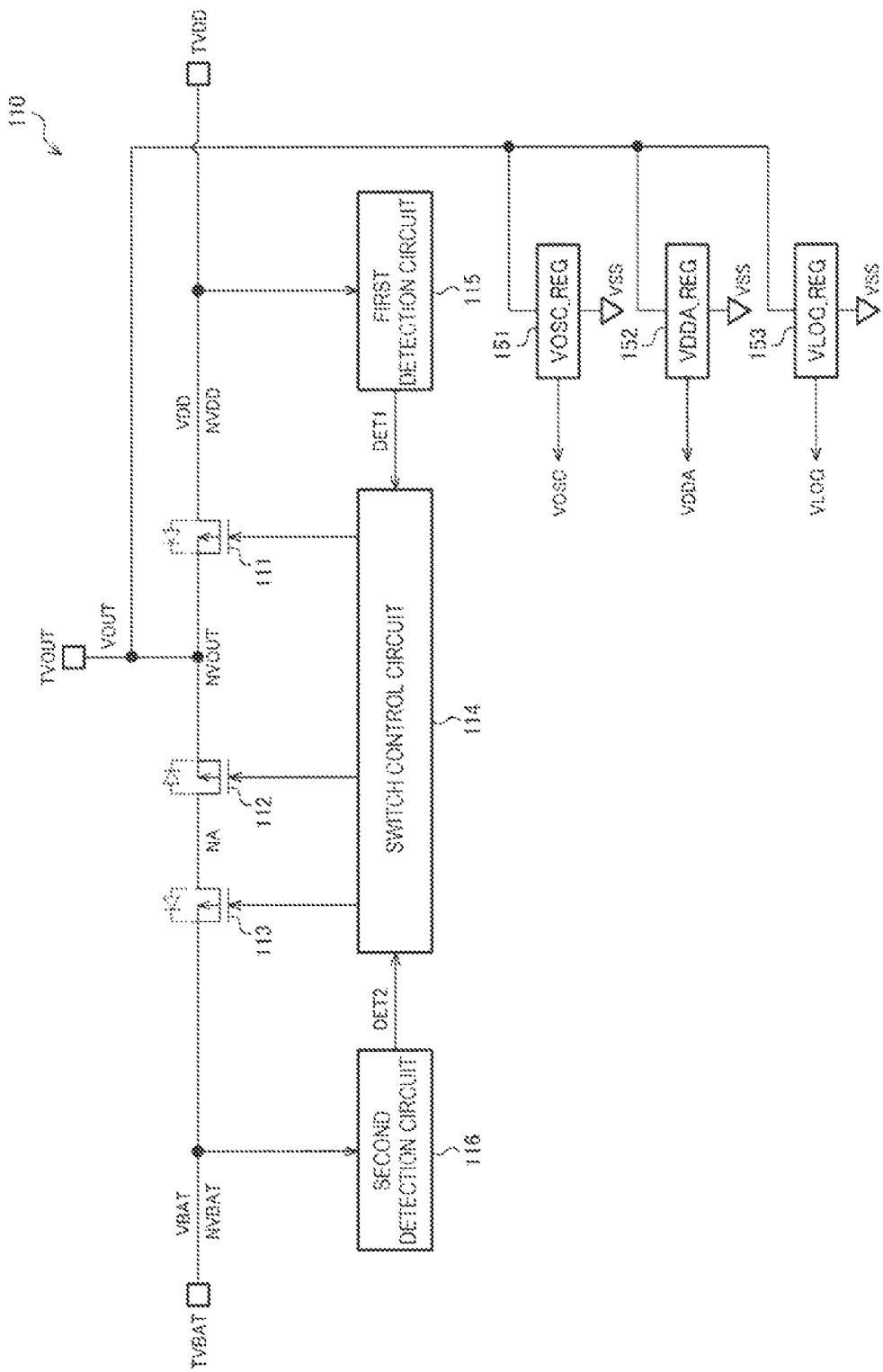
FIG. 9 is a detailed configuration example of a power supply circuit.

FIG. 9 is a detailed configuration example of the power supply circuit 110. The power supply circuit 110 includes P-type transistors 111 to 113, a switch control circuit 114, a first detection circuit 115, a second detection circuit 116, and regulators 151 to 153.

The first detection circuit 115 detects whether the power supply voltage VDD of the power supply voltage node NVDD is lower than a first detection voltage, and outputs the result to the switch control circuit 114 as a first detection signal DET1. The first detection circuit 115 includes a voltage-dividing resistor circuit that divides the power supply voltage VDD, and a comparator that compares the divided voltage with the first detection voltage. The second detection circuit 116 detects whether the battery voltage VBAT of a battery voltage node NVBAT is lower than a second detection voltage, and outputs the result to the switch control circuit 114 as a second detection signal DET2. The second detection circuit 116 includes a voltage-dividing resistor circuit that divides the battery voltage VBAT, and a comparator that compares the divided voltage with the second detection voltage. The first detection voltage and the second detection voltage are generated by, for example, a voltage generation circuit (not shown).

One of a source and a drain of the P-type transistor 111 is coupled to the power supply voltage node NVDD, and a back gate and the other of the source and the drain of the P-type transistor 111 are coupled to a node NVOUT. One of a source and a drain of the P-type transistor 112 is coupled to a node NA, and a back gate and the other of the source and the drain of the P-type transistor 112 are coupled to the node NVOUT. One of a source and a drain of the P-type transistor 113 is coupled to the node NA, and a back gate and the other of the source and the drain of the P-type transistor 113 are coupled to the battery voltage node NVBAT. A diode indicated by a dotted line in FIG. 9 is a parasitic diode generated between the back gate and one of the source and the drain.

The switch control circuit 114 controls the P-type transistors 111 to 113 to be turned on or off based on the first detection signal DET1 and the second detection signal DET2. Specifically, when it is detected that the power supply voltage VDD is higher than the first detection voltage, the switch control circuit 114 turns on the P-type transistor 111 and turns off the P-type transistors 112 and 113. As a result, the voltage VOUT=VDD is output to the node NVOUT. When it is detected that the power supply voltage VDD is lower than the first detection voltage, and it is detected that the battery voltage VBAT is higher than the second detection voltage, the switch control circuit 114 turns off the P-type transistor 111 and turns on the P-type transistors 112 and 113. As a result, the voltage VOUT=VBAT is output to the node NVOUT.

The regulator 151 generates the power supply voltage VOSC by regulating the voltage VOUT, and outputs the power supply voltage VOSC to the oscillation circuit 150. The regulator 152 generates the power supply voltage VDDA by regulating the voltage VOUT, and outputs the power supply voltage VDDA to the temperature detection circuit 160. The regulator 153 generates the power supply voltage VLOG by regulating the voltage VOUT, and outputs the power supply voltage VLOG to the processing circuit 120. The regulators 151 to 153 are linear regulators including, for example, an operational amplifier and a resistor.

In the present embodiment described above, the circuit device 100 includes the regulator 153 and the processing circuit 120. The regulator 153 generates the second power supply voltage as the monitoring target voltage from the first power supply voltage. In FIGS. 8 and 9, the power supply voltage VDD is the first power supply voltage, and the power supply voltage VLOG is the second power supply voltage. The processing circuit 120 operates based on the second power supply voltage, and is reset and released from reset by the power-on reset signal PORQ.

For example, when the power supply voltage VDD or the battery voltage VBAT is first supplied to the circuit device 100, or when the voltage VOUT is temporarily decreased due to a decrease in the power supply voltage VDD or the like, the processing circuit 120 is reset and released from reset. When power-on reset is not normally performed, an alternative method such as soft reset through the interface circuit 170 is required. By applying the power-on reset circuit 130 in FIG. 4 to FIG. 8, reset is not released at an unintended voltage, and therefore, reliable reset and release from reset are possible. When the power supply voltage VDD is decreased, the power supply circuit 110 switches the power supply voltage VDD to the battery voltage VBAT, and it is necessary to switch before the power supply voltage VDD is decreased to a voltage at which the power-on reset is performed. Assuming that the power supply voltage VDD at which the power-on reset is performed is a minimum value, it is desirable that the minimum value is lower than an operable voltage of the processor. That is, it is desirable to switch to a backup power supply at the power supply voltage at which the processor cannot operate. The power-on reset circuit 130 shown in FIGS. 1 and 4 is applied to FIG. 8, and includes the reference voltage generation circuit 132 and the comparator 133, so that it is possible to reduce, as much as possible, the minimum value in which the reset is not performed when the power supply voltage VDD is decreased.

The circuit device according to the present embodiment described above includes: a comparator; a reference voltage generation circuit; and a coupling control circuit. The comparator is configured to output a power-on reset signal by comparing a monitoring target voltage generated from a power supply voltage with a reference voltage. The reference voltage generation circuit is configured to generate the reference voltage and output the reference voltage to a reference voltage node. The coupling control circuit is coupled between a reference voltage node and a power supply voltage node to which the power supply voltage is supplied. The coupling control circuit couples the reference voltage node and the power supply voltage node in a predetermined period after the power supply voltage is supplied.

According to the present embodiment, since the coupling control circuit couples the reference voltage node and the power supply voltage node in the predetermined period after the power supply voltage is supplied to the circuit device, the monitoring target voltage does not exceed a determination voltage of the comparator in the predetermined period. The determination voltage is a sum of the reference voltage after converging to a predetermined voltage and an offset voltage of the comparator. When the coupling control circuit dis-couples the reference voltage node and the power supply voltage node after the predetermined period is elapsed, the reference voltage converges to an intended predetermined voltage. As a result, after the reference voltage converges to the intended predetermined voltage, the comparator can compare the monitoring target voltage with the reference voltage.

In the present embodiment, the coupling control circuit may include: a switch provided between the power supply voltage node and the reference voltage node; and a CR circuit configured to output, to the switch, a control signal for controlling the switch from ON to OFF when the predetermined period is elapsed after the power supply voltage is supplied.

According to the present embodiment, since the switch is turned on in the predetermined period after the power supply voltage is supplied, the reference voltage node is coupled to the power supply voltage node. Accordingly, the reference voltage input to the comparator becomes the power supply voltage in the predetermined period after the power supply voltage is supplied. Since the switch changes from ON to OFF when the predetermined period is elapsed, the comparator can compare the reference voltage with the monitoring target voltage.

In the present embodiment, the CR circuit may include a capacitor, and outputs the control signal to the switch. The control signal may transition from an active state to an inactive state when the predetermined period is elapsed. The predetermined period may be determined by a capacitance value of the capacitor. The switch may change from ON to OFF when the control signal changes from the active state to the inactive state.

According to the present embodiment, the predetermined period is set by the capacitance value of the capacitor. The CR circuit can output the control signal that changes from the active state to the inactive state when the predetermined period is elapsed.

In the present embodiment, the circuit device may include a bias circuit configured to generate a bias voltage. The CR circuit may include a first P-type transistor that is provided between the power supply voltage node and one end of the capacitor, and includes a gate configured to receive the bias voltage.

According to the present embodiment, the first P-type transistor serves as a constant current source, and charges the capacitor by inputting a constant current to the one end of the capacitor. A length of the predetermined period is determined by a current value of the constant current and the capacitance value of the capacitor.

In the present embodiment, the CR circuit may include an N-type transistor whose drain is coupled to the one end of the capacitor and whose source and gate are coupled to a ground node.

The first P-type transistor has a parasitic diode whose forward direction is a direction from the one end of the capacitor to the power supply voltage node, and the N-type transistor has a parasitic diode whose forward direction is a direction from the one end of the capacitor to the ground node. As a result, when the power supply voltage is supplied, a voltage at the one end of the capacitor rises from an approximately determined voltage, and the predetermined period can be made substantially constant.

In the present embodiment, the CR circuit may include: a first inverter configured to receive the voltage of the one end of the capacitor; a second inverter configured to receive the output signal of the first inverter and output the control signal; and a second P-type transistor provided between the power supply voltage node and one end of the capacitor and including a gate configured to receive the output signal of the first inverter.

According to the present embodiment, the first inverter changes the output signal from a high level to a low level when the voltage at the one end of the capacitor exceeds a logic threshold voltage. As a result, a period from when the power supply voltage is supplied to when the voltage at the one end of the capacitor exceeds the logic threshold voltage is the predetermined period. According to the present embodiment, when the output signal of the first inverter changes from the high level to the low level, the second P-type transistor changes from OFF to ON, and couples the one end of the capacitor and the power supply voltage node. Accordingly, the second P-type transistor functions as a latch mechanism that maintains a reset release state after the reset is released.

In the present embodiment, the reference voltage generation circuit may be configured to generate the reference voltage based on the power supply voltage.

When the switch couples the reference voltage node and the power supply voltage node, the power supply voltage node and a source of the transistor in the reference voltage generation circuit are coupled via the switch and the transistor in the reference voltage generation circuit. Although it is not desirable to couple different power supply voltages such as the power supply voltage and an internal power supply voltage, according to the present embodiment, the source of the transistor in the reference voltage generation circuit is coupled to the power supply voltage node.

In the present embodiment, the circuit device may include a bias circuit configured to generate a bias voltage. The reference voltage generation circuit may include a depletion N-type transistor and an enhancement N-type transistor. The depletion N-type transistor is provided between the power supply voltage node and the reference voltage node, and includes a gate configured to receive the bias voltage. The enhancement N-type transistor may be provided between the reference voltage node and the ground node, and may include a gate configured to receive the bias voltage.

According to the present embodiment, since the offset voltage of the comparator can be reduced and the reference voltage can be adjusted, a minimum value of the power supply voltage at which the comparator normally operates can be lowered.

In the present embodiment, the circuit device may further include a regulator and a processing circuit. The regulator may be configured to generate, when the power supply voltage is a first power supply voltage, a second power supply voltage as the monitoring target voltage from the first power supply voltage. The processing circuit may be configured to operate based on the second power supply voltage, and may be configured to be reset and released from reset by the power-on reset signal.

When the processing circuit is reset and released from reset using the power-on reset circuit according to the present embodiment, reset is not released at an unintended voltage, so that the processing circuit can be reliably reset and released from reset.

In addition, the real-time clock device according to the present embodiment includes: the circuit device described in any one of the above; and a resonator. The circuit device includes: a regulator; a processing circuit; and an oscillation circuit. The regulator is configured to generate, when the power supply voltage is a first power supply voltage, a second power supply voltage as the monitoring target voltage from the first power supply voltage. The processing circuit is configured to operate based on the second power supply voltage, and be reset and released from reset by the power-on reset signal. The oscillation circuit is configured to generate a clock signal by oscillating the resonator. The processing circuit includes a timing circuit configured to perform a timing process based on the clock signal.

In this way, the circuit device according to the present embodiment can be applied to the real-time clock device. When the processing circuit is reset and released from reset using the power-on reset circuit according to the present embodiment, the reset is not released at an unintended voltage, so that the processing circuit of the real-time clock device can be reliably reset and released from reset.

Although the present embodiment has been described in detail as described above, it will be readily apparent to those skilled in the art that many modifications may be made without departing substantially from novel matters and effects of the present disclosure. Therefore, all such modifications are intended to be included within the scope of the present disclosure. For example, a term cited with a different term having a broader meaning or the same meaning at least once in the disclosure or on the drawings can be replaced with the different term in any place in the disclosure or on the drawings. Further, all combinations of the embodiment and the modifications are also included in the scope of the present disclosure. The configurations, operations, and the like of the power-on reset circuit, the circuit device, and the real-time clock device are not limited to those described in the present embodiment, and various modifications can be made.

What is claimed is:

1. A circuit device, comprising:
a comparator configured to output a power-on reset signal by comparing a monitoring target voltage generated from a power supply voltage with a reference voltage;
a reference voltage generation circuit configured to generate the reference voltage and output the reference voltage to a reference voltage node; and
a coupling control circuit coupled between the reference voltage node and a power supply voltage node to which the power supply voltage is supplied, wherein
the coupling control circuit couples the reference voltage node and the power supply voltage node in a predetermined period after the power supply voltage is supplied.

2. The circuit device according to claim 1, wherein the coupling control circuit includes:
a switch provided between the power supply voltage node and the reference voltage node; and
a CR circuit configured to output, to the switch, a control signal for controlling the switch from ON to OFF when the predetermined period is elapsed after the power supply voltage is supplied.

3. The circuit device according to claim 2, wherein the CR circuit includes a capacitor, and outputs the control signal to the switch,
the control signal transitions from an active state to an inactive state when the predetermined period is elapsed,
the predetermined period is determined by a capacitance value of the capacitor, and
the switch changes from ON to OFF when the control signal changes from the active state to the inactive state.

4. The circuit device according to claim 3, further comprising:
a bias circuit configured to generate a bias voltage, wherein
the CR circuit includes a first P-type transistor provided between the power supply voltage node and one end of the capacitor and including a gate configured to receive the bias voltage.

5. The circuit device according to claim 4, wherein the CR circuit includes an N-type transistor whose drain is coupled to the one end of the capacitor and whose source and gate are coupled to a ground node.

6. The circuit device according to claim 4, wherein the CR circuit includes:
a first inverter configured to receive a voltage of the one end of the capacitor;
a second inverter configured to receive an output signal of the first inverter and output the control signal; and
a second P-type transistor provided between the power supply voltage node and one end of the capacitor and including a gate configured to receive the output signal of the first inverter.

7. The circuit device according to claim 1, wherein the reference voltage generation circuit is configured to generate the reference voltage based on the power supply voltage.

8. The circuit device according to claim 1, further comprising:
a bias circuit configured to generate a bias voltage, wherein
the reference voltage generation circuit includes:
a depletion N-type transistor provided between the power supply voltage node and the reference voltage node and including a gate configured to receive the bias voltage; and
an enhancement N-type transistor provided between the reference voltage node and a ground node and including a gate configured to receive the bias voltage.

9. The circuit device according to claim 1, further comprising:
a regulator configured to generate, when the power supply voltage is a first power supply voltage, a second power supply voltage as the monitoring target voltage from the first power supply voltage; and a processing circuit configured to operate based on the second power supply voltage and to be reset and released from reset by the power-on reset signal.

10. A real-time clock device, comprising:

the circuit device according to claim 1; and a resonator, wherein the circuit device includes:

a regulator configured to generate, when the power supply voltage is a first power supply voltage, a second power supply voltage as the monitoring target voltage from the first power supply voltage;

a processing circuit configured to operate based on the second power supply voltage and to be reset and released from reset by the power-on reset signal; and an oscillation circuit configured to generate a clock signal by oscillating the resonator, and the processing circuit includes a timing circuit configured to perform a timing process based on the clock signal.

\* \* \* \* \*